United States Patent [19]

Harriman

[11] Patent Number: 4,525,595
[45] Date of Patent: Jun. 25, 1985

[54] RADIATION RESISTANT CLOSURE

[75] Inventor: Robert W. Harriman, Milford, Conn.

[73] Assignee: Keene Corporation, Norwalk, Conn.

[21] Appl. No.: 491,399

[22] Filed: May 4, 1983

[51] Int. Cl.³ ............................................. H05K 9/00
[52] U.S. Cl. ................................................ 174/35 GC
[58] Field of Search ................... 174/35 GC, 35 MS; 219/10.55 D; 277/236

[56] References Cited

U.S. PATENT DOCUMENTS

| | | | |
|---|---|---|---|
| 2,757,225 | 7/1956 | Dunn | 174/35 |
| 3,504,095 | 3/1970 | Roberson et al. | 174/35 |
| 3,507,974 | 4/1970 | Clark et al. | 174/35 |
| 3,962,550 | 6/1976 | Kaiserwerth | 174/35 GC |
| 4,039,741 | 8/1977 | Havens | 174/35 GC |

OTHER PUBLICATIONS

Lockhart "Twin Flex Contact", IBM Tech. Disclosure Bulletin, vol. 13, No. 10, Mar. 1971, p. 3095.
Lockhart "Double Receptacle Shielding", IBM Tech. Disclosure Bulletin, vol. 14, No. 8, Jan. 1972, p. 2534.

Primary Examiner—A. T. Grimley
Assistant Examiner—D. A. Tone
Attorney, Agent, or Firm—Pennie & Edmonds

[57] ABSTRACT

A radiation resistant joint between an edge of a movable member and a corresponding edge of a fixed member. The joint comprises at least two bowed conductive contact fingers fixed at one end to one of the members with one finger superimposed over the other finger. The free end of the upper finger engages the bow portion of the lower finger. Means are provided for moving the lower finger and consequently the upper finger away from the member with which they are attached such that the bow portions of each finger engage a conductive plate on the other member to make a radiation resistant seal therewith.

5 Claims, 2 Drawing Figures

RADIATION RESISTANT CLOSURE

FIELD OF THE INVENTION

This invention relates to a radiation resistant closure and more particularly to a radiation resistant closure having at least two conductive contact fingers movable into contact with a plate to make an electrically conductive contact therewith.

BACKGROUND OF THE INVENTION

Radiation resistant closures are known in which inflatable tubes are utilized to move flexible conductive contact strips mounted on one member into conductive contact with a plate mounted on another member. An advantage of such a construction is that wear and tear of the contact strips is reduced because the strips are not subjected to the sliding action of the plate passing over the strips during opening and closing movement of the members relative to one another since the tube is inflated only after the members are in a closed position with respect to each other. For example, in U.S. Pat. No. 2,757,225, there is disclosed a door for a radio shielded enclosure having an inflatable tube contained in the edges of a door for a moving contact member made of a thin flexible sheet metal strip into contact with a conductive strip mounted on the edges of a door frame. Because the sheet metal strip is of solid construction, it is important that the door fit accurately in its frame so as to assure that all portions of the strip along its length will be in conductive contact with portions of the door frame when the tube is inflated. The need for accurate and close fitting between the door frame and door necessarily increases cost of production.

Conductive strips in the form of comb-like bowed fingers such as disclosed in U.S. Pat. No. 3,589,070 have been proposed where the bowed portions of the fingers flex outwardly of a member to which they are mounted to conductively engage a conductive plate mounted on another member. The individual fingers are easily flexed so that they will accommodate variations in spacing between the members. However since the strips containing the fingers are made of a light flexible material, such as beryllium copper, the fingers can be easily broken or bent out of shape, which if this occurs, can lead to impairment of radiation seal integrity.

It is therefore an object of my invention to provide for a closure for forming a radiation resistant joint which may utilize the advantages of conductive strips having a plurality of comb-like conductive bowed fingers and which at the same time will insure integrity of a seal even in the event one of the fingers is broken off or bent out of shape.

Broadly a radiation resistant joint according to the invention comprises first and second resilient electrically conductive contact fingers where each finger has a bowed portion comprising a part of a finger strip affixed to an edge of either a movable member or a fixed member. The second resilient fingers are affixed at one end in an overlapping relation to an end of the first fingers with both fingers being connected to an edge of one of the members. The free ends of the second fingers overlap and engages the bowed portions of the first fingers. Bowed portions of both fingers are adapted to engage a conductive plate on the other member with which the fingers are not connected so that the fingers form a conductive seal between the edges of the members.

Preferably the fingers are in a comb-like strip and are made of an electrically conductive material, such as for example, beryllium copper.

Further an inflatable tube is preferably positioned between the first fingers and the member to which it is connected such that when the tube is inflated, it will move the bowed portions of the first fingers and the free ends and bowed portions of the second fingers outwardly towards a conductive plate of the other member. When the tube is in a deflated condition, the natural flexure of the fingers will move the bowed portions of the fingers out of contact with the conductive plate. By this construction the fingers are protected from damage when the members are moved to a closed position with respect to one another where the conductive plate is free to slide over the fingers without contact during opening and closing movement of the members. Further use of an inflatable tube to move the fingers outwardly into conductive engagement with the plate allows the fingers to be positioned in a groove contained in the member the sides of which give further protection against inadvertent damage to the fingers.

The fingers and inflatable tube may be mounted on either the edges of the movable door member or on the edges of a fixed frame member surrounding the door. The conductive plate would be mounted on a corresponding edge of the other member. Preferably the fingers and tube extend around the complete periphery of either the door or fixed frame.

DETAILED DESCRIPTION OF THE PREFERRED EMBODIMENTS

Figure 1:
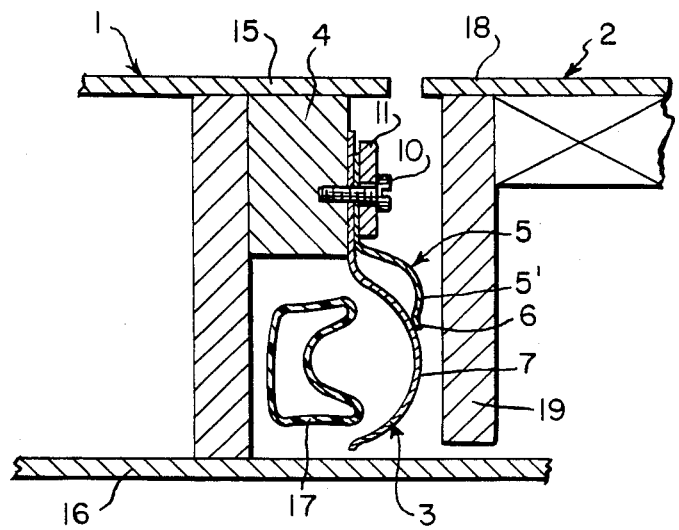
FIG. 1 is a cross-sectional view of a portion of edges of a door and corresponding edge of a fixed frame having a closure according to the invention in an unsealed position.
Figure 2:
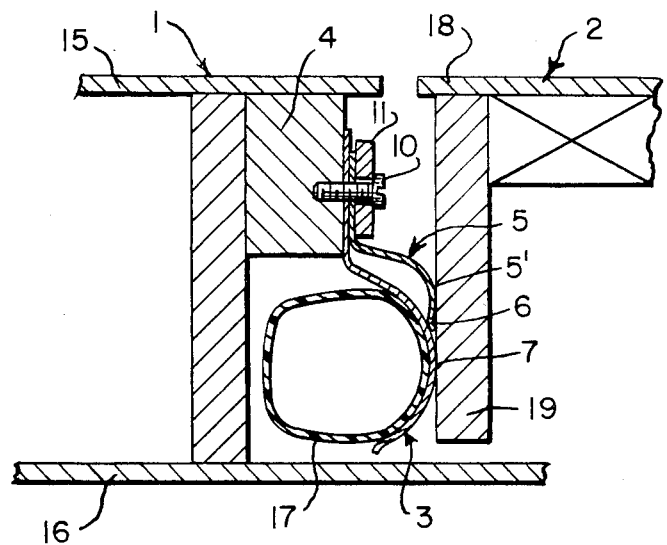
FIG. 2 is a view similar to FIG. 1 showing the closure in a sealing position.

Referring to FIGS. 1 and 2 there is illustrated a movable door member 1 and a fixed frame member 2 with the door member being in a closed position with respect to the fixed frame member. A first bowed finger 3 is connected at one end to a conductive strip 4 forming part of the door member. A second bowed finger 5 is also connected to the strip 4 and in overlapping relation to the finger 3 such that the free end 6 of the second finger 5 engages the bowed portion 7 of the first finger 3.

The first and second fingers 3 and 5 comprise comb-like strips and are connected to the conductive strip 4 by means of a screw 10 engaging a clamp 11 between which the ends of finger strips are positioned. Other means, for example riveting or welding, could be used to connect the finger strips to the conductive strip.

The door 1 comprises conductive side plates 15 and 16 preferably of a ferrous material so as to provide a shielded structure. An inflatable tube 17 is positioned between the side plates 15 and 16 and is adapted to be connected to a source of fluid pressure, not shown.

The fixed frame member 2 has a side plate 18 comprising ferrous material also forming a shielding structure. A conductive plate 19 is connected to the plate 18 and extends perpendicularly thereto. As shown in FIG. 2 the plate 19 is adapted to be contacted by the bowed portions 7 and 5' of the finger strips 3 and 5 so that a conductive connection is made at two points. Thus if one of the fingers is broken off or bent out of shape, the other finger will continue to make sealing contact with the plate to insure integrity of radiation resilient joints between the members.

The inflatable tube 17 comprises an elastomeric material which has a memory to assume the shape shown in FIG. 1 when deflated to assure that the fingers 3 and 5 may spring or flex out of contact with the plate 19.

The side plate 16 may as shown in the figures extend in the righthand direction beyond the plate 19 so as to provide some degree of protection to the tube 17 and fingers when the door member is in an open position with respect to the frame member.

While the arrangement shown in FIGS. 1 and 2 includes having the fingers and inflatable tube mounted in a door member, the fingers and inflated tube could instead be mounted in a fixed frame member and the conductive plate adapted to contact the fingers would then be part of the door member.

Contact fingers constructed according to the invention are also applicable for use as face seals between a sliding type door which is adapted to slide parallel to a wall to cover or close a wall opening. In this instance the fingers would be affixed to the face of the wall around the wall opening to engage the face of the door, or, alternatively, would be affixed to the face of the door around its periphery to engage the face of the wall around the door opening.

Further while two fingers are shown superimposed, further fingers could be added so as to be superimposed on the second finger 5 if further radio frequency attenuation was desired.

I claim:

1. A radiation resistant joint between a movable member and a fixed member comprising first and second resiliently electrically conductive contact fingers each having a bowed portion, a fixed end and a free end with the fixed end of said second finger in overlapping relationship with the fixed end of the first finger and with both ends fixed to one of said members and with both fingers extending in the same direction and with the free end of said second finger overlapping and engaging the bowed portion of the first finger, and a conductive plate on the other said member adapted to engage the bowed portion of both said fingers.

2. A closure for forming a radiation resistant joint between the edges of a movable member and edges of a fixed member adapted to surround the movable member, the closure for one edge of the movable member and a corresponding edge of the fixed member comprising:
   a. First and second resilient electrically conductive contact fingers each having a bowed portion and each affixed at one end to one of the members with opposite free ends of both fingers extending in the same direction and with a free end of the second finger overlapping and engaging the bowed portion of the first finger;
   b. An inflatable tube positioned between the first finger and the member to which it is attached adapted when inflated to move the fingers outwardly from the member to which they are attached; and
   c. An electrically conductive plate on the other member adapted to be moved relative to said fingers when the members are moved relative to each other between open and closed positions whereby when the members are in a closed position with respect to each other, said fingers will normally flex out of contact with the plate and wherein the bowed portions of said fingers will be forced into contact with the plate when said tube is inflated.

3. A closure for forming a radiation resistant joint according to claim 2 wherein said member with which the fingers are connected comprises a movable door and the other said member comprises a fixed door frame.

4. A closure for forming a radiation resistant joint according to claim 2 wherein said fingers are connected to said one of said members through a conductive strip extending the length of one edge of said one member.

5. A radiation resistant joint between a door and a frame surrounding the door comprising at least two electrically conductive finger strips each having a bowed portion extending along the length of at least one edge of the door with the finger strips being connected in overlapping relation at one end to a conductive strip carried by the door with the opposite free ends of both fingers extending in the same direction and with the free end of one finger strip overlapping and contacting the bowed portion of another finger strip, an inflatable tube extending along the length of the finger strips and positioned between the finger strips and the door, a conductive plate on the frame extending parallel to the direction of movement of the door and adapted to be engaged by the bowed portions of the finger strips when said tube is inflated to form a radiation resistant seal between said plate and said finger strips.

* * * * *